(12) United States Patent
Kari

(10) Patent No.: US 7,500,855 B2
(45) Date of Patent: Mar. 10, 2009

(54) COAXIAL CONNECTOR ASSEMBLY WITH SELF-ALIGNING, SELF-FIXTURING MOUNTING TERMINALS

(75) Inventor: Thomas Andrew Kari, Waseca, MN (US)

(73) Assignee: Emerson Network Power Connectivity Solutions, Bannockburn, IL (US)

( * ) Notice: Subject to any disclaimer, the term of this patent is extended or adjusted under 35 U.S.C. 154(b) by 0 days.

(21) Appl. No.: 11/554,406

(22) Filed: Oct. 30, 2006

(65) Prior Publication Data
US 2008/0102654 A1 May 1, 2008

(51) Int. Cl.
*H01R 12/00* (2006.01)
(52) U.S. Cl. .......................................... 439/63; 439/79
(58) Field of Classification Search .................. 439/63, 439/578, 581, 580, 79, 80, 59
See application file for complete search history.

(56) References Cited

U.S. PATENT DOCUMENTS

| | | | | |
|---|---|---|---|---|
| 4,826,447 A | * | 5/1989 | Forker et al. | 439/328 |
| 5,044,963 A | * | 9/1991 | Kukkonen et al. | 439/55 |
| 5,404,117 A | * | 4/1995 | Walz | 333/34 |
| 6,238,218 B1 | | 5/2001 | Baffert | |
| 6,341,988 B1 | * | 1/2002 | Zhu et al. | 439/630 |
| 6,457,979 B1 | * | 10/2002 | Dove et al. | 439/63 |
| 6,468,089 B1 | * | 10/2002 | Hubbard et al. | 439/63 |
| 6,663,424 B1 | | 12/2003 | Wyse et al. | |

* cited by examiner

*Primary Examiner*—Neil Abrams
*Assistant Examiner*—Phuong Nguyen
(74) *Attorney, Agent, or Firm*—Sonnenschein Nath & Rosenthal LLP; Brian R. McGinley

(57) ABSTRACT

A self-fixturing, self-aligning coaxial connector assembly is provided. The coaxial connector assembly comprises a coaxial connector, a coaxial housing and a printed circuit board. The printed circuit board is aligned properly with the electrical end of the coaxial connector when mounted on the coaxial housing and is held in place while the printed circuit board is coupled to the coaxial housing.

18 Claims, 5 Drawing Sheets

Fig. 4
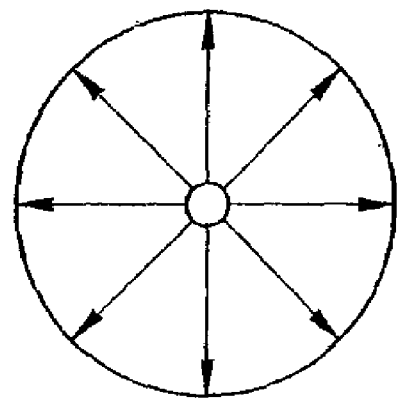
Fig. 5
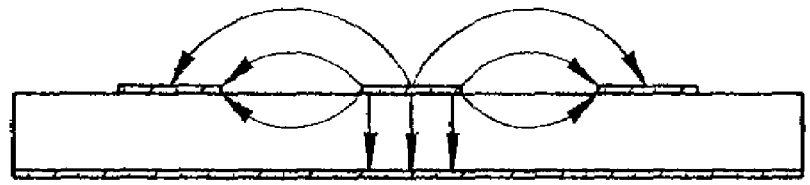
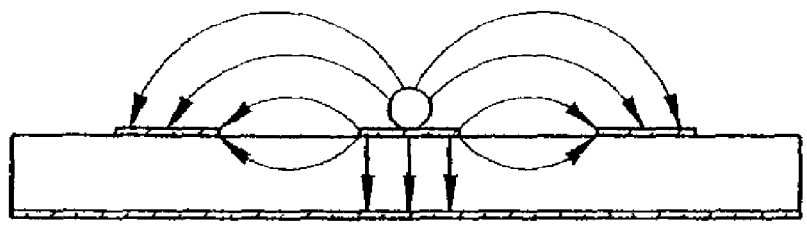
Fig. 6

COAXIAL CONNECTOR ASSEMBLY WITH SELF-ALIGNING, SELF-FIXTURING MOUNTING TERMINALS

FIELD OF THE INVENTION

The present invention relates generally to coaxial connector assemblies for use in securing an end launch coaxial connector to an electronic device such as a printed circuit board. More specifically, the present invention comprises a coaxial housing which secures, for example, an end launch coaxial connector through one or more self-aligning, self-fixturing mounting terminals of the coaxial housing to a device such as a printed circuit board.

BACKGROUND OF THE INVENTION

There are a variety of known ways to secure a coaxial connector to an electrically conductive substrate such as a printed circuit board (PCB). One common way is soldering or bonding the two together. Proper alignment of the coaxial connector and the PCB is essential for optimal operation, and it is often difficult to align the coaxial connector properly with a signal trace on the PCB while bonding the coaxial connector. A series of connective and other problems can occur if there is misalignment or if the coaxial connector is not secured effectively.

FIG. 4 illustrates the electric field patterns of a coaxial device cross section. FIG. 5 illustrates a coplanar circuit with "ground under." FIG. 6 illustrates the same coplanar circuit with a contact applied to the signal trace of the PCB for the purpose of launching the signal between the planar and coaxial devices. It is critical that the coaxial connector center contact be coplanar or nearly coplanar to the signal trace on the PCB for efficient signal transfer. Any disposition of the contact away from the PCB surface causes additional fringe capacitive effects and makes bonding more difficult to achieve. Excessive capacitance causes impedance error and signal loss in radio frequency (RF) circuitry.

There are several known approaches to keep the coaxial connector aligned and stationary for attachment to a PCB. For example, U.S. Pat. No. 5,404,117 discloses an electronic connector for connecting a coaxial cable to a microstrip transmission line or to a coplanar transmission line. To ensure proper alignment of the PCB and coaxial cable the optimal connection is detected with an electronic device before attachment, requiring time and adjustment.

Referring to FIG. 1, in this approach an end launch coaxial connector 14 has cooperating straight and parallel terminals 15a, 15b manufactured with a fixed separation gap 16 to receive a PCB. The gap 16 created between the signal side terminals and the ground side terminals is of a width equal to the thickness of the PCB thickness plus the appropriate tolerance buildup (typically 0.006"). FIG. 2 illustrates PCB 17 misaligned with center connector 18. If PCB 17 is soldered in the configuration illustrated in FIG. 2, the connection between center contact 18 and PCB 17 will be poor.

FIG. 3 illustrates a fixture 19 that can be used to hold in place the center contact 18 and the PCB 17. Fixture 19 is used to secure the coaxial connector 14 and PCB 17 during the bonding process to maintain coplanarity of center contact 18 to the PC trace. Fixture 19 is also needed to keep the axis of center contact 18 parallel to the PCB plane for proper alignment to mating connectors, electronic housing enclosure ports, and associated packaging hardware. Coaxial connector 14 and PCB 17 each have to be placed on fixture 19 and be properly aligned. If fixture 19 is moved or bumped before bonding occurs it can lead to misalignment of the center contact 18 and the PC trace on PCB 17.

It is essential and some times difficult to ensure proper alignment between the center contact and the PC trace on the PCB efficiently and on a consistent basis. Therefore, it would be beneficial to provide a coaxial housing that has the ability to align the center contact and PCB easily and hold in place until soldering or other bonding can occur. It would also be beneficial if the coaxial housing is manufactured at that same time as the coaxial connector and is part of the coaxial connector.

Besides misalignment, excessive soldering can create a poor signal so it is important to be precise when bonding the coaxial connector. Therefore, it would be beneficial to provide a system for fixing the PCB and the coaxial connector that does not involve the user doing anything else but applying the bonding material.

SUMMARY OF THE INVENTION

The present invention relates to a self-fixturing, self-aligning coaxial connector assembly. A principal object of the present invention is to provide a coaxial housing for an end launch coaxial connector that has a self alignment feature and a self fixturing feature in order to provide the proper alignment of the coaxial connector with the PCB and a self supportive structure in order to keep the PCB in place until the coaxial connector is coupled to the PCB. The coaxial housing can provide alignment and fixture of a PCB that is assembled to a fixed end launch coaxial connector or multiple coax feed thru block until the PCB is bonded to the coaxial housings. The present invention comprises a coaxial connector having a center contact protruding from a signal end of the coaxial connector along the center axis of the coaxial connector and a coaxial housing having an opening in the approximate center of the coaxial housing where the coaxial contact protrudes through the opening. The coaxial housing has at least one arm protruding from the face of the coaxial housing and at least one leg protruding from the face of the coaxial housing at the base of the coaxial housing. The legs protrude at a slight upward angle from the base of coaxial connector. The arms are generally coplanar to the center contact. The legs are offset from the plane of the center contact and generally parallel with the arms. A gap is created between the arms and the legs that is approximately the width of the PCB. The PCB is placed in the gap between the arms and legs which automatically aligns the PCB properly with the center contact. The arms and legs are also self-fixturing so that the PCB will be held in place while a bonding agent is applied to bond the center contact with the PCB. The assembly provides proper mounting, alignment and securement of the PCB while the PCB and the coaxial connector are bonded.

The foregoing and other objects are intended to be illustrative of the invention and are not meant in a limiting sense. Many possible embodiments of the invention may be made and will be readily evident upon a study of the following specification and accompanying drawings comprising a part thereof. Various features and subcombinations of invention may be employed without reference to other features and subcombinations. Other objects and advantages of this invention will become apparent from the following description taken in connection with the accompanying drawings, wherein is set forth by way of illustration and example, an embodiment of this invention and various features thereof.

BRIEF DESCRIPTION OF THE DRAWINGS

A preferred embodiment of the invention, illustrative of the best mode in which the applicant has contemplated applying the principles, is set forth in the following description and is shown in the drawings and is particularly and distinctly pointed out and set forth in the appended claims.

FIG. 4 is a schematic illustration of the electric field of a coaxial transmission line.

FIG. 5 is a schematic illustration of the electric field coplanar circuit with ground under.

FIG. 6 is a schematic illustration of the electric field of a coplanar circuit with a center contact soldered to the signal trace on the PCB.

DETAILED DESCRIPTION OF THE PREFERRED EMBODIMENTS

As required, one or more detailed embodiments of the present invention are disclosed herein; however, it is to be understood that the disclosed embodiments are merely exemplary of the principles of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Figure 1:
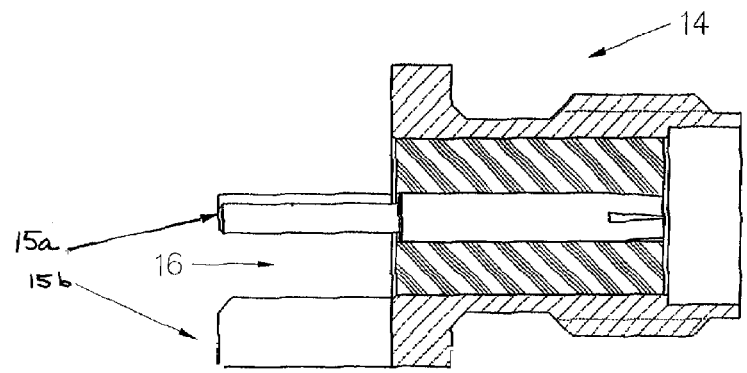
FIG. 1 (prior art) is a sectional view of a known end launch coaxial connector.
Figure 2:
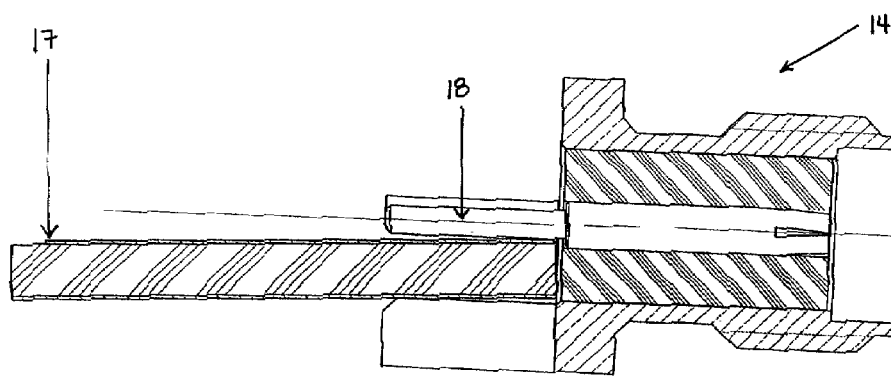
FIG. 2 (prior art) illustrates the connector of FIG. 1 with a misaligned PCB.
Figure 3:
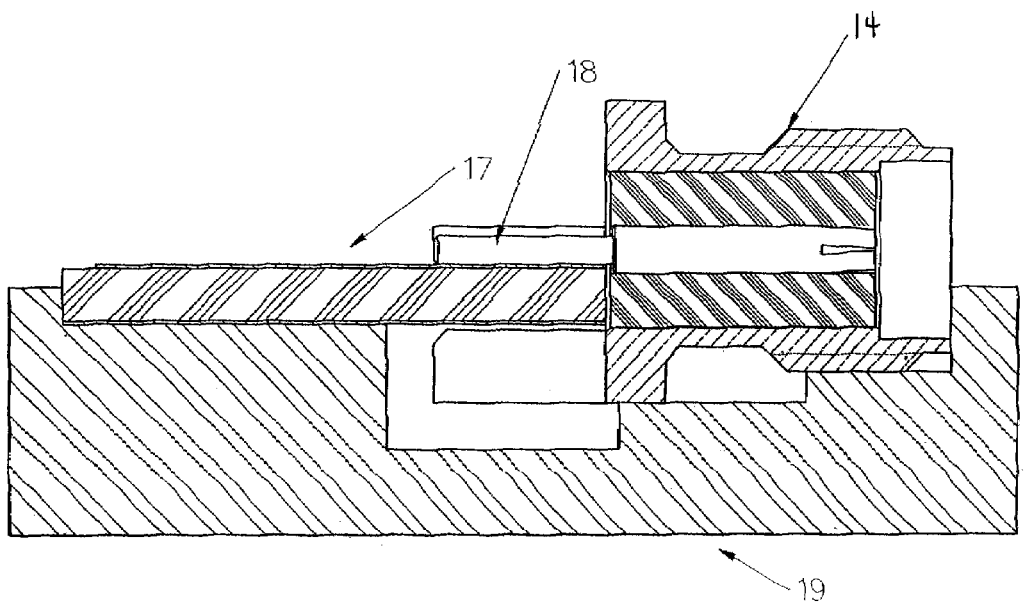
FIG. 3 (prior art) illustrates the connector of FIG. 1 with a fixture device used to stabilize the PCB during soldering.
Figure 7:
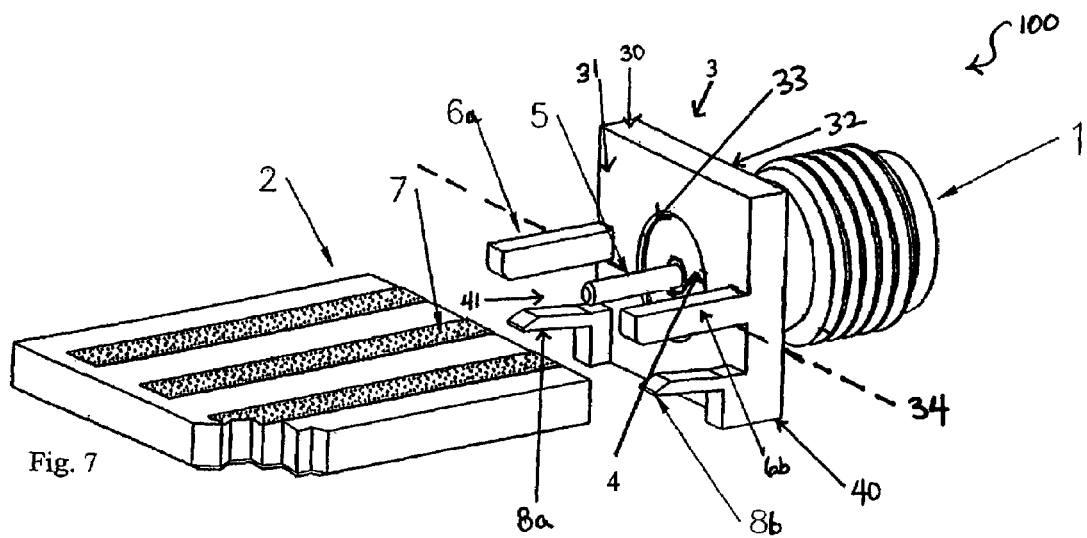
FIG. 7 is a perspective view of a coaxial connector assembly illustrating an exemplary embodiment of the present invention.
Figure 8:
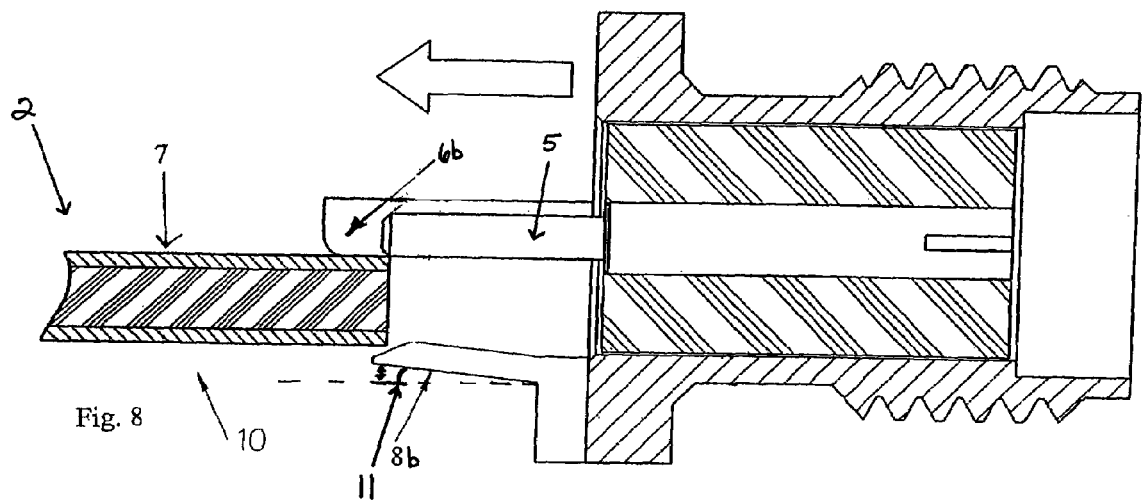
FIG. 8 is a sectional view of the coaxial connector assembly of FIG. 7 showing a PCB partially inserted into a coaxial housing of the coaxial connector.
Figure 9:
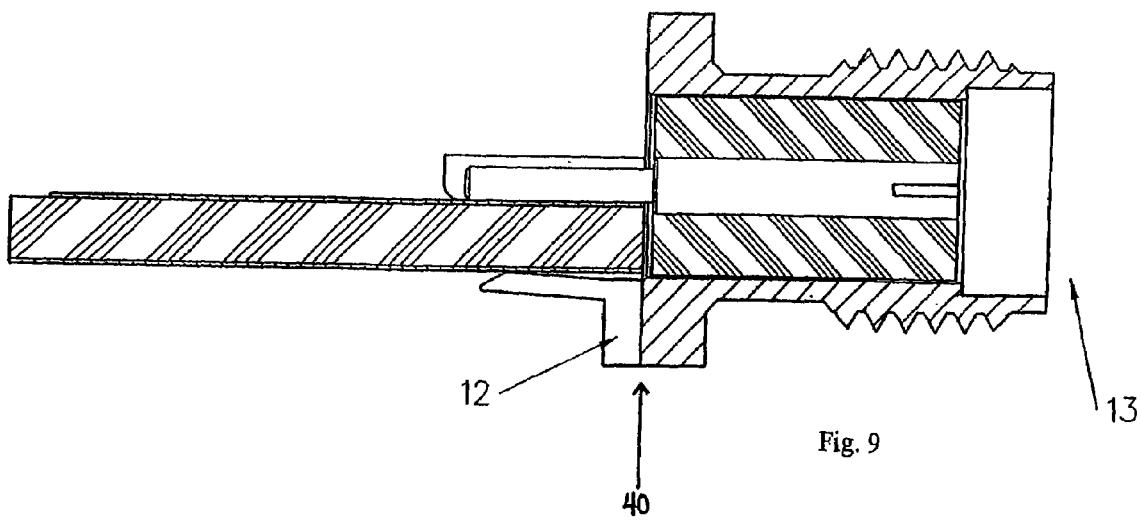
FIG. 9 is a sectional view of the coaxial connector assembly showing the PCB fully inserted into the coaxial housing.

A preferred embodiment of a coaxial connector assembly 100 of the present invention, illustrated in FIGS. 7-9, comprises a coaxial connector 1, an electrically conductive substrate such as PCB 2, and a coaxial housing 3. PCB 2 is a conventional printed circuit board or other electronic planer device with at least a signal side 7 and a ground side 10 opposing signal side 7. The coaxial connector 1 has at least one electronic contact 5 protruding from a circuit end 4 of coaxial connector 1. Coaxial housing 3 has a main body 30 with a front 31, a rear 32, and an opening 33 between the front 31 and the rear 32. In the preferred embodiment illustrated in FIG. 7, coaxial housing 3 has a pair of arms 6a, 6b protruding from front 31. Bottom surfaces of arms 6a, 6b are generally coplanar to a center line 34 of the opening 33. In a preferred embodiment, the ends of arms 6a, 6b are rounded or sloped on the front bottom edge farthest from front 31. Coaxial housing 3 has a pair of legs 8a, 8b protruding from front 31 at a base 40 of front 31. Legs 8a, 8b are positioned on a plane offset from the coincident plane of center contact 5 and arms 6a, 6b by a distance equal to PCB 2 thickness plus appropriate tolerance buildup of approximately 10%. A gap 41 is created for PCB 2. Legs 8a, 8b extend from base 40 at an angle 11 measuring approximately less than or equal to 10 degrees. In a preferred embodiment, illustrated in FIG. 8, angle 11 is 6 degrees and include sloped outer tips. In a preferred embodiment coaxial housing 3 and coaxial connector 1 are manufactured of the same material, at the same time and as one unit.

Referring to FIG. 7, the coaxial connector 1 is mounted to the coaxial housing 3. Center contact 5 protrudes through opening 33 such that center contact 5 and arms 6a, 6b are generally coplanar. Arms 6a, 6b and center contact 5 provide termination to signal side 7 of PCB 2. Legs 8a, 8b provide termination to PCB 2 ground side 10. PCB 2 can be mounted in gap 41 between arms 6a, 6b and legs 8a, 8b in alignment with center contact 5. Angle 11 reduces the gap width provided for PCB 2.

Figure 10:
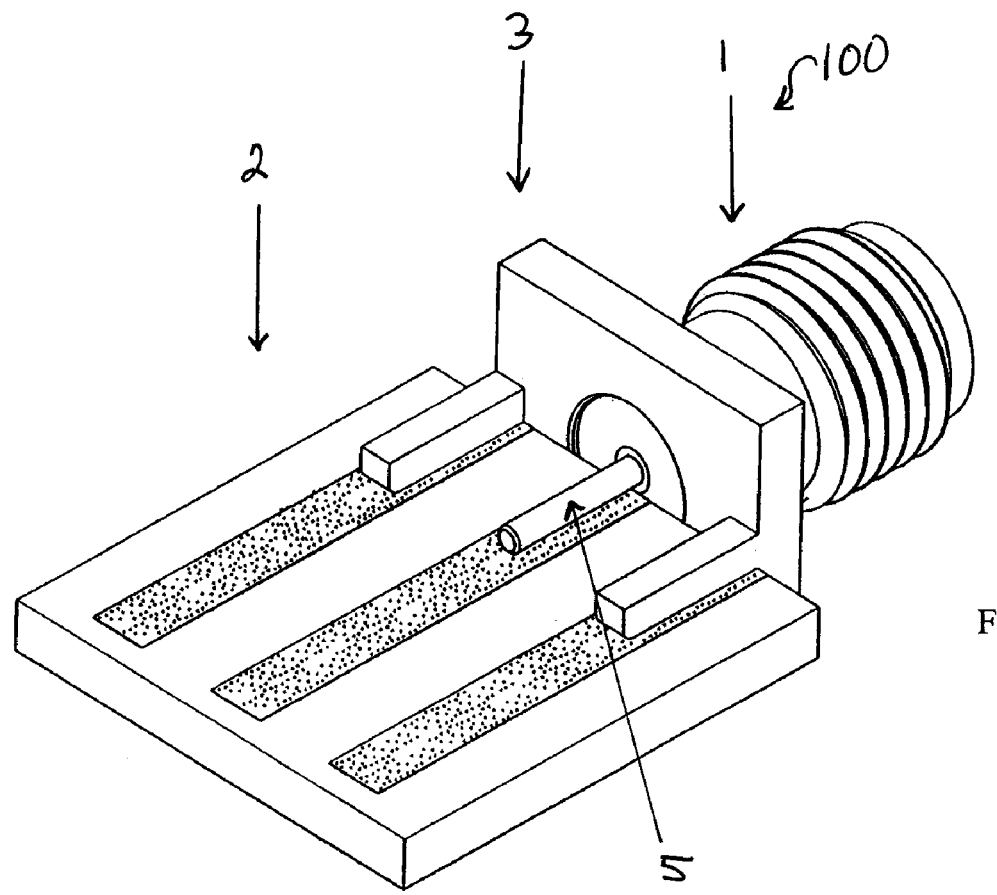
FIG. 10 is a perspective view of the coaxial connector assembly showing the coaxial housing coupled to the PCB.
Figure 11:
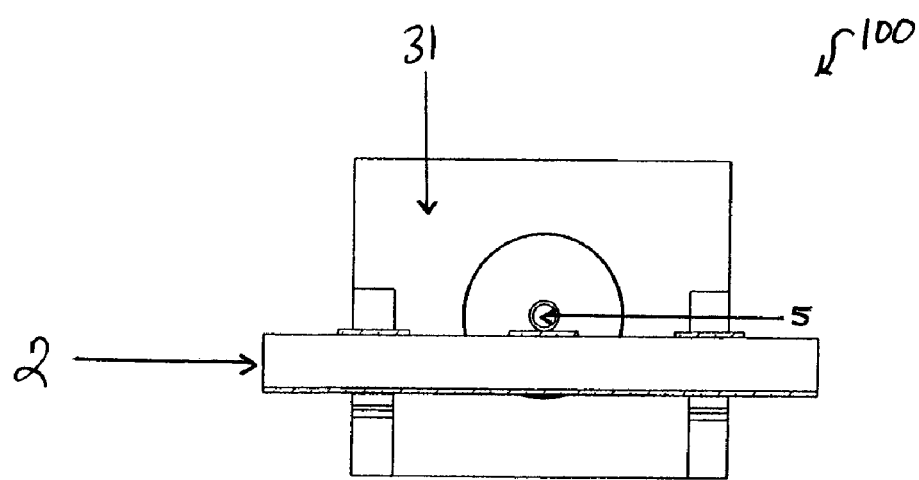
FIG. 11 is a front view of a coaxial connector coupled with a coaxial housing coupled to a PCB.

Referring to FIG. 8, when coaxial connector 1 is pushed onto the edge of a fixed PCB 2 legs 8a and 8b, provide a continuous spring force that acts upon ground side 10 of PCB 2 and in a direction normal to PCB 2 circuit planes. Center contact 5 is forced against signal side 7 of PCB 2. The reactant force between arms 6a, 6b and the surface of PCB 2 causes the center contact 5 to align nearly parallel to signal side 7 of PCB 2. Legs 8a, 8b create a normal force on ground side 10 of PCB 2. The normal force creates an equal and opposite force on signal side 7 against the center contact 5 and arms 6a, 6b. This is a gripping force to hold coaxial connector 1 and center contact 5 in position on PCB 2 until a bonding agent is applied to the arms and legs and PCB joints. This coaxial housing design eliminates the need for additional fixture support during the bonding of coaxial connector 1 and PCB 2. FIGS. 10 and 11 illustrate coaxial connector assembly 100, with center contact 5 of coaxial connector 1 properly aligned with PCB 2.

Coaxial connector 1 and coaxial housing 3 may be fixed and PCB 2 is slid into gap 41, or PCB 2 may be fixed and coaxial connector 1 and coaxial housing 3 can be pushed onto PCB 2. Either way the spring force caused by legs 8a, 8b provide alignment and gripping forces to push and hold PCB 2 parallel and against the coaxial center contact plane until bonding agent is applied to the appropriate places.

In one embodiment, the ends of arms 6a, 6b and legs 8a, 8b and center contact 5 have chamfer or radius ends to improve assembly to the PCB without excessive insertion forces or excessive scraping of PCB materials.

Referring to FIG. 9, in a preferred embodiment, coaxial housing 3 has a thickened boss 12 at base 40 of one or more legs 8a, 8b to increase the shear strength of legs 8a, 8b and coaxial housing 3. This provides the necessary strength to survive the shear moments that occur in the coaxial housings when a mating connector is coupled at a mating end 13 of coaxial connector 1 and torqued to specified operating values.

Figure 12:
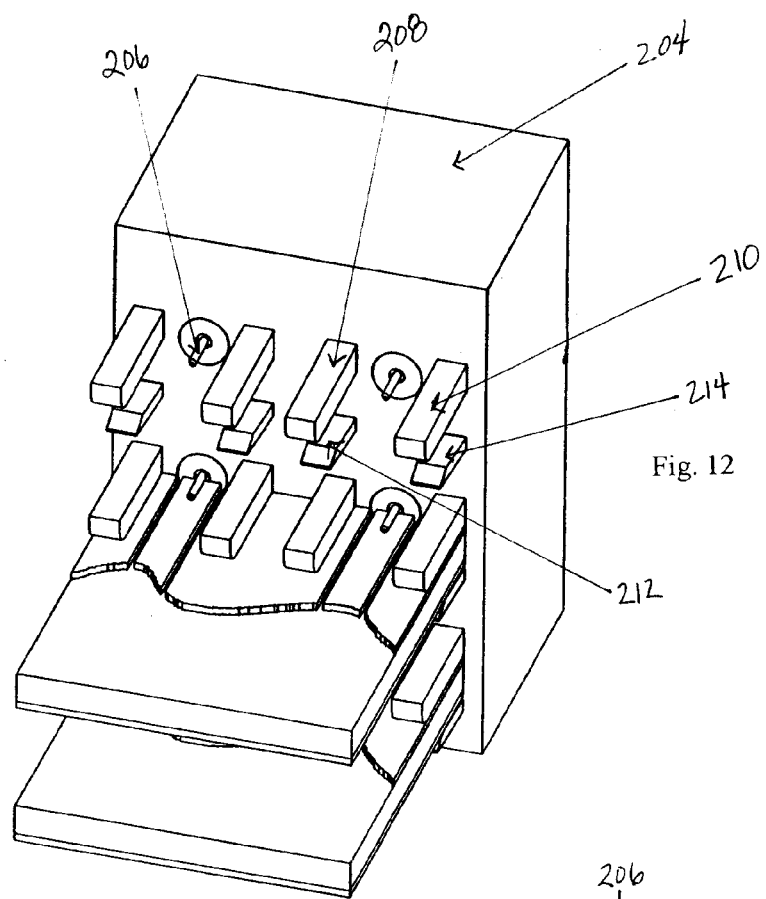
FIG. 12 is a perspective view of a modified embodiment of the present invention showing a multi-port coaxial feed with multiple coaxial housings and multiple PCBs coupled to coaxial housings.
Figure 13:
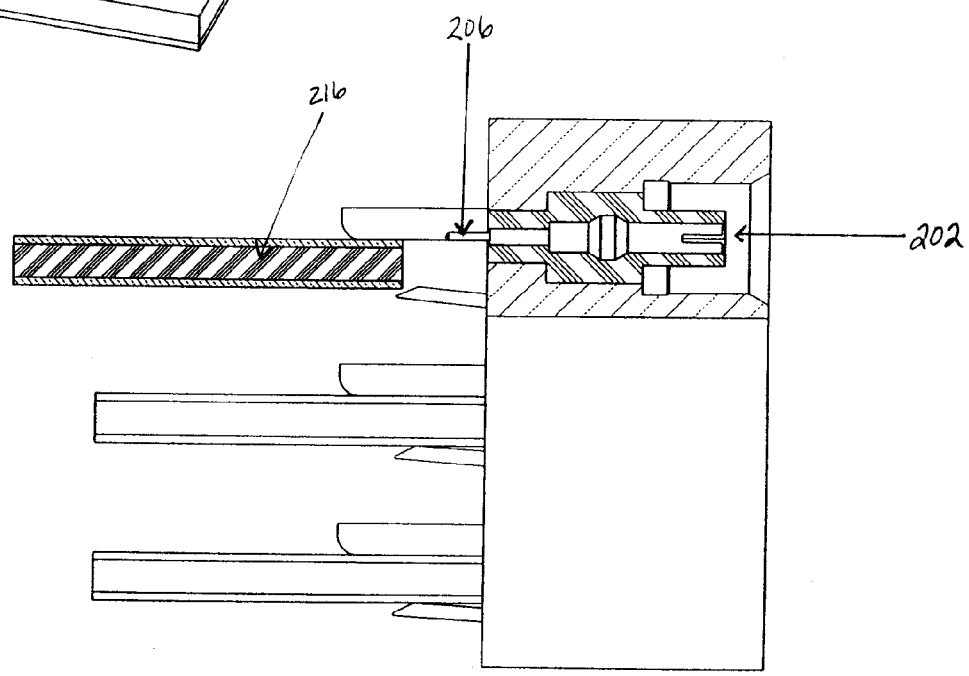
FIG. 13 is a partial sectional view of the embodiment depicted in FIG. 12.

In a modified embodiment of the present invention, illustrated in FIGS. 12 and 13, a multi-port coaxial connector assembly 200 comprises at least one coaxial connector 202 enclosed within a housing 204. An electrically conductive tip 206 protrudes generally outward from a front face of the housing 204. A plurality of pairs of arms 208, 210 and legs 212, 214 are formed along the front surface of the housing 204. The arms 208, 210 and legs 212, 214 are configured in a manner similar to that described above for receiving and mounting one or more PCB 216.

In the foregoing description, certain terms have been used for brevity, clearness and understanding; but no unnecessary limitations are to be implied therefrom beyond the requirements of the prior art, because such terms are used for descriptive purposes and are intended to be broadly construed. Moreover, the description and illustration of the inventions is by way of example, and the scope of the inventions is not limited to the exact details shown or described.

Although the foregoing detailed description of the present invention has been described by reference to an exemplary embodiment, and the best mode contemplated for carrying out the present invention has been shown and described, it will be understood that certain changes, modification or variations may be made in embodying the above invention, and in the construction thereof, other than those specifically set forth herein, may be achieved by those skilled in the art without departing from the spirit and scope of the invention, and that such changes, modification or variations are to be considered as being within the overall scope of the present invention. Therefore, it is contemplated to cover the present invention and any and all changes, modifications, variations, or equivalents that fall with in the true spirit and scope of the underlying principles disclosed and claimed herein. Consequently, the scope of the present invention is intended to be limited only by the attached claims, all matter contained in the above description and shown in the accompanying drawings shall be interpreted as illustrative and not in a limiting sense.

Having now described the features, discoveries and principles of the invention, the manner in which the invention is constructed and used, the characteristics of the construction, and advantageous, new and useful results obtained; the new and useful structures, devices, elements, arrangements, parts and combinations, are set forth in the appended claims.

It is also to be understood that the following claims are intended to cover all of the generic and specific features of the invention herein described, and all statements of the scope of the invention which, as a matter of language, might be said to fall therebetween.

What is claimed is:

1. An assembly for mounting a connector to an electrically conductive substrate, comprising:
    a connector with a center contact protruding from a signal end of the connector along a center axis of the connector;
    a housing having an arm and a leg extending generally outward from a face of the housing; and
    wherein the arm and leg are configured to resiliently receive and support the substrate for mounting the substrate to the connector.

2. The assembly of claim 1 wherein the arm and the leg are spaced by a distance equal to the substrate thickness plus approximately 10%.

3. The assembly of claim 1 wherein the leg has a spring loaded joint wherein the joint is angled upward.

4. The assembly of claim 1 wherein the leg has a thickened boss where the leg protrudes from the housing.

5. The assembly of claim 1 wherein the arm, the leg and the center contact have chamfer or radius ends.

6. The assembly of claim 1 wherein the connector is a coaxial connector.

7. The assembly of claim 1 wherein a bottom surface of the arm is coplanar to a bottom surface of the center contact and further wherein the leg extends from the housing at an upward angle creating a force to secure the substrate between the arm and the leg.

8. The assembly of claim 7 wherein the upward angle measures between 3 and 10 degrees from where the leg extends from the housing.

9. An assembly for mounting a connector to an electrically conductive substrate, comprising:
    a connector with a center contact protruding from a signal end of the connector along a center axis of the connector; and
    a housing having an arm and a leg extending generally outward from a face of the housing, the leg having a leg bottom surface that is coplanar with a housing bottom surface,
    wherein the connector is encased within the housing with the center contact protruding through the housing, and the arm and leg are configured to receive and support the substrate for mounting the substrate to the connector,
    wherein the leg has a spring loaded joint wherein the joint is angled upward.

10. The assembly of claim 9 further comprising two or more connectors with two or more center contacts protruding through the housing, wherein there is at least one corresponding arm and at least one corresponding leg for every center contact.

11. The assembly of claim 9 wherein the arm and the leg are spaced by a distance equal to the substrate thickness plus approximately 10%.

12. The assembly of claim 9 wherein the leg has a thickened boss where the leg protrudes from the housing.

13. The assembly of claim 9 wherein the arm, the leg and the center contact have chamfer or radius ends.

14. The assembly of claim 9 wherein the connector is a coaxial connector.

15. The assembly of claim 9 further comprising:
    a leg upper surface having a first leg upper surface portion and a second leg upper surface portion,
    wherein the first leg upper surface portion abuts the second leg upper surface portion.

16. The assembly of claim 9 wherein the leg bottom surface has a first leg bottom surface portion and a second leg bottom surface portion, and the first leg bottom surface portion and second leg bottom surface portion are separated by a bottom surface intermediary portion.

17. The assembly of claim 9 wherein a bottom surface of the arm is coplanar to a bottom surface of the center contact and further wherein the leg extends from the housing at an upward angle creating a force to secure the substrate between the arm and the leg.

18. The assembly of claim 17 wherein the upward angle measures between 3 and 10 degrees from where the leg extends from the housing.

* * * * *